United States Patent
Hase et al.

(10) Patent No.: US 9,711,216 B2
(45) Date of Patent: Jul. 18, 2017

(54) SEMICONDUCTOR STORAGE DEVICE

(71) Applicant: Renesas Electronics Corporation, Tokyo (JP)

(72) Inventors: Takashi Hase, Tokyo (JP); Naoya Furutake, Tokyo (JP); Koji Masuzaki, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/962,777

(22) Filed: Dec. 8, 2015

(65) Prior Publication Data

US 2016/0276026 A1    Sep. 22, 2016

(30) Foreign Application Priority Data

Mar. 16, 2015 (JP) ................. 2015-051855

(51) Int. Cl.
*G11C 11/00* (2006.01)
*G11C 13/00* (2006.01)

(52) U.S. Cl.
CPC ...... *G11C 13/0069* (2013.01); *G11C 13/0064* (2013.01); *G11C 13/0097* (2013.01); *G11C 2013/0073* (2013.01); *G11C 2013/0092* (2013.01); *G11C 2213/72* (2013.01); *G11C 2213/79* (2013.01); *G11C 2213/82* (2013.01)

(58) Field of Classification Search
CPC .. G11C 13/0002; G11C 11/14; G11C 13/0004
USPC .................. 365/148, 163, 158, 171, 173
See application file for complete search history.

(56) References Cited

U.S. PATENT DOCUMENTS

| | | | |
|---|---|---|---|
| 5,436,913 A | 7/1995 | Yamamura et al. | |
| 8,804,401 B2 | 8/2014 | Sugimae et al. | |
| 2011/0176351 A1* | 7/2011 | Fujitsuka | G11C 11/5685 365/148 |
| 2013/0250654 A1* | 9/2013 | Sugimae | G11C 13/0002 365/148 |

(Continued)

FOREIGN PATENT DOCUMENTS

| | | |
|---|---|---|
| JP | H06-60674 A | 3/1994 |
| JP | 2005-044454 A | 2/2005 |
| JP | 2013-200922 A | 10/2013 |

*Primary Examiner* — Han Yang
(74) *Attorney, Agent, or Firm* — McGinn IP Law Group, PLLC

(57) ABSTRACT

When writing ReRAM cells, it is pursued to set the cells in a sufficiently high or low resistance state, while preventing excessive writing. Disclosed is a semiconductor storage device including memory cells, each including a variable resistance element, and control circuitry that executes an Off writing process of applying Off writing pulse to a memory cell to turn it into high resistance state and an On writing process of applying On writing pulse to turn it into low resistance state. The control circuitry, when the memory cell is placed in low resistance state, after applying Off writing pulse, applies a reading pulse for a verify process of reading whether it is placed in high or low resistance state. If the memory cell is not placed in high resistance state as a result of the verify process, the control circuitry applies a reset pulse comprising On writing pulse, applies Off writing pulse with extended pulse width and executes the verify process in mentioned order.

22 Claims, 11 Drawing Sheets

(56) References Cited

U.S. PATENT DOCUMENTS

2014/0098593 A1* 4/2014 Calderoni ............... G11C 11/00
                                                         365/148

* cited by examiner

FIG. 5
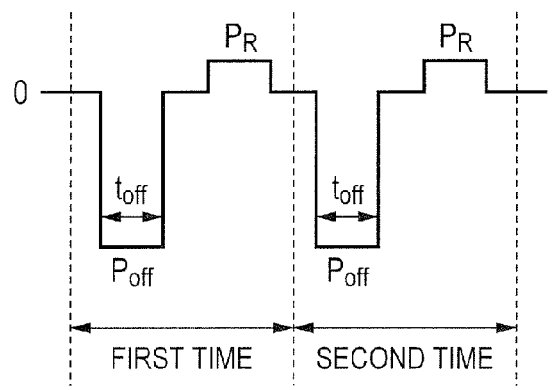
| | $WL_1$ | $BL_1$ | $PL_1$ | $WL_n$ | $BL_n$ | $PL_n$ |
|---|---|---|---|---|---|---|
| ON WRITING | $V_{w1}$ | GND | $V_{on}$ | GND | GND | GND |
| OFF WRITING | $V_{w2}$ | $V_{off}$ | GND | GND | GND | GND |
| READING | $V_{w3}$ | GND | $V_R$ | GND | GND | GND |
n≠1
FIG. 6
FIG. 7
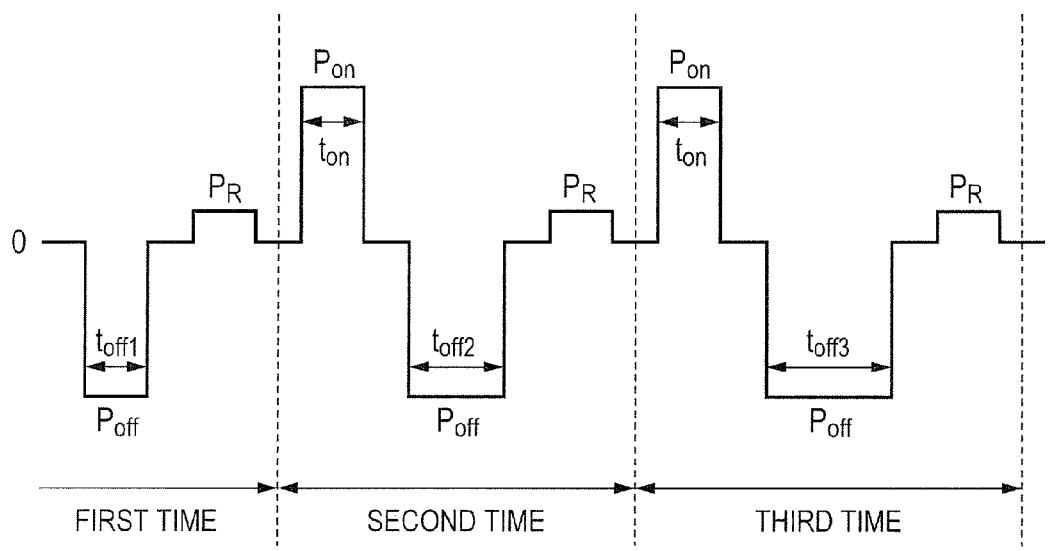

ON WRITING | OFF WRITING (VERIFY)

FIRST TIME | SECOND TIME | THIRD TIME

SEMICONDUCTOR STORAGE DEVICE

CROSS-REFERENCE TO RELATED APPLICATIONS

The disclosure of Japanese Patent Application No. 2015-051855 filed on Mar. 16, 2015 including the specification, drawings and abstract is incorporated herein by reference in its entirety.

BACKGROUND

The present invention relates to a semiconductor storage device and, particularly, resides in a technique that is applicable to a semiconductor device using variable resistance elements.

Patent Document 1 (Japanese Published Unexamined Patent Application No. 2013-200922) describes a verify writing method that, when setting a cell of a Resistance Random Access Memory (ReRAM) in a low resistance state, if the resistance value of the cell has not reached a desired value after the execution of applying a writing pulse and verify reading, repeats a series of processing operations as follows: applying a pulse of opposite polarity→applying a rewriting pulse→verify reading. Patent Document 2 (Japanese Published Unexamined Patent Application No. Hei 06(1994)-60674) and Patent Document 3 (Japanese Published Unexamined Patent Application No. 2005-44454 respectively describe verify writing methods that execute verify writing, while increasing the time during which a writing pulse of the same polarity is applied.

SUMMARY

The methods described in P Japanese Published Unexamined Patent Application No. Hei 06(1994)-60674 and Japanese Published Unexamined Patent Application No. 2005-44454, when applied to ReRAM, have a problem below: once a ReRAM cell has been set in an intermediate resistance state, i.e., neither high nor low resistance state, a sufficient current or voltage necessary for switching is not applied even by repeatedly applying a writing pulse of the same polarity, which may make it hard to change the resistance state.

On the other hand, the method described in Japanese Published Unexamined Patent Application No. 2013-200922 can cope with the above problem by applying a pulse of opposite polarity after very reading. However, when gradually increasing the voltage and pulse width of the writing pulse (or when keeping them constant), the above method is to gradually increase the voltage and pulse width of the pulse of opposite polarity likewise (or keep them constant) accordingly. Therefore, it is impossible for this method to sufficiently exert an effect that is obtained by gradually increasing the voltage and pulse width of the writing pulse in the process of attempts of repeating writing. That is, this method has a problem below: it is impossible to sufficiently exert a verify effect in which, when writing a memory cell to set it in a low resistance state, writing under optimal conditions is accomplished by repeating attempts, while gradually changing balance with writing of opposite polarity and changing conditions.

Furthermore, the above document only describes operations for writing a memory cell to set it in a low resistance state (On writing), but there is no description about whether such method is applicable to writing a memory cell to set it in a high resistance state (Off writing) among others.

Other problems and novel features will become apparent from the description in the present specification and the accompanying drawings.

A semiconductor storage device according to one embodiment includes memory cells, each including a variable resistance element, and control circuitry that executes a first writing process of applying a first writing pulse to the memory cell to turn the memory cell state into a first resistance state in which the resistance value of the variable resistance element meets a first criterion and a second writing process of applying a second writing pulse of opposite polarity to the first writing pulse to turn the memory cell into a second resistance state meeting a second criterion.

The control circuitry, when the memory cell is placed in the second resistance state, after applying the first writing pulse to the memory cell, applies a reading pulse for a verify process of reading whether the variable resistance element is placed in the first resistance state or the second resistance state. If the memory cell is not placed in the first resistance state as a result of the verify process, the control circuitry applies a reset pulse formed of the second writing pulse to the memory cell, applies the first writing pulse with a pulse width made longer than the first writing pulse applied last, and executes the verify process in mentioned order.

According to the above one embodiment, it is possible to set ReRAM cells in a sufficiently high or low resistance state, while preventing excessive writing.

BRIEF DESCRIPTION OF THE DRAWINGS

FIG. 5 is a diagram representing patterns of voltage to be applied to each line when writing or reading is performed.

FIG. 6 is a diagram depicting an example of a waveform of a voltage which is ordinarily applied when verify writing is performed to turn a memory cell MC into an OFF state.

FIG. 7 is a diagram depicting an example of a waveform of a voltage which is applied when verify writing is performed to turn a memory cell into an Off state, according to a first embodiment of the present invention.

DETAILED DESCRIPTION

In the following, embodiments of the invention will be described in detail based on the drawings. In all the drawings for describing the embodiments, identical components are assigned the same referential numbers or marks and their description is not repeated.

Because of, inter alia, characteristic variation of resistance elements of ReRAM, ReRAM cells corresponding to bits may have a too high or too low value as a resistance value (Off resistance) in a high resistance state (Off state). For cells which have a too low value of Off resistance, a method of extending the width of a pulse for Off writing can be taken as one method for characteristic improvement to make their resistance value as high as possible. However, extending the pulse width may make the Off resistance value too high, which may delay switching to a low resistance state (On state) during On writing which is performed subsequently or, in some instances, may result in failure of On writing for some bits.

Therefore, in embodiments which will be described hereinafter, as a method for optimizing Off writing so that ReRAM cells will have sufficient Off resistance, while preventing excessive writing as noted above, a pulse of opposite direction is once applied before rewriting in a process of verify rewriting in which the pulse width is increased gradually during Off writing. In this process, balance when Off writing is executed is changed appropriately by keeping the pulse width and voltage of the pulse of opposite direction constant, thereby making it possible to perform optimal Off writing. Embodiments which will be described hereinafter do not apply only to Off writing; these embodiments are also applicable to On writing in the same way, unless otherwise stated.

First Embodiment

Figure 1:
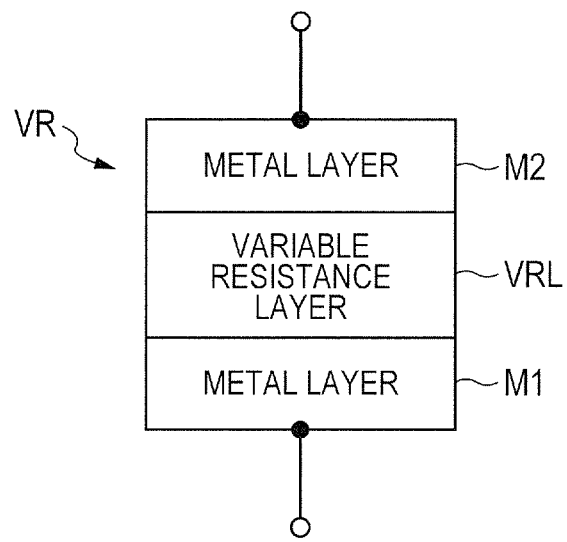
FIG. 1 is a diagram depicting a schematic structure example of a variable resistance element for use in ReRAM.

FIG. 1 is a diagram depicting a schematic structure example of a variable resistance element for use in ReRAM.

A variable resistance element VR has a structure in which a variable resistance layer VRL is sandwiched between metal layers M1 and M2. The metal layers M1 and M2 form first and second electrodes, respectively. The variable resistance layer VRL can be changed to a low resistance state (On state) by applying a positive voltage with respect to the metal layer M1 to the metal layer M2 and can be changed to a high resistance state (Off state) by applying a positive voltage with respect the metal layer M2 to the metal layer M1. One bit of information is stored by making the On and Off states correspond to 0 and 1 or 1 and 0, respectively.

The variable resistance layer VRL is made of, e.g., metallic oxide (for example, a tantalic oxide, titanium oxide, zirconium oxide, or hafnium oxide). The variable resistance layer VRL of this instance may be a monolayer film or laminated film. Supposing that the variable resistance layer VRL is a laminated film, the variable resistance layer VRL may be a laminated film with layers having different combinations of types of elements or a laminated film with layers having the same combination of types of elements, where the oxygen composition ratio of each layer differs. The film thickness of the variable resistance layer VRL is, e.g., between 1.5 nm to 30 nm inclusive. Each of the metal layers M1 and M2 is made of, e.g., ruthenium, titanium nitride, tantalum, tantalum nitride, tungsten, palladium, or platinum.

Figure 2:
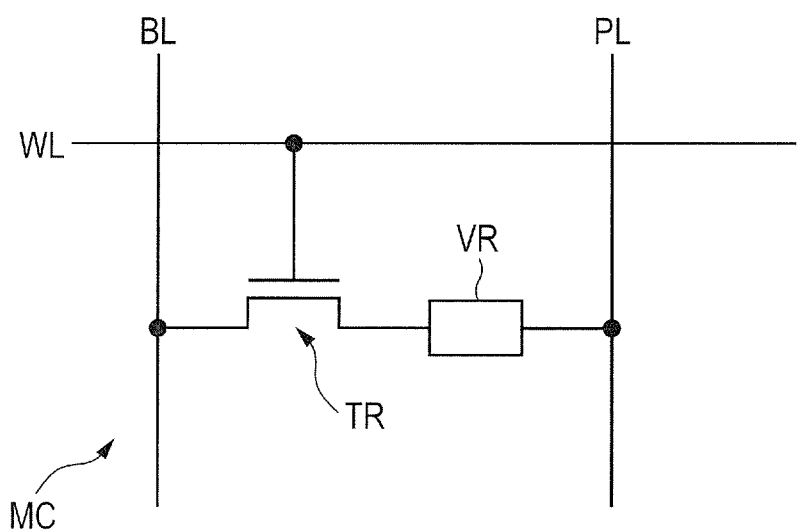
FIG. 2 is a diagram depicting a schematic structure example of a memory cell.

FIG. 2 is a diagram depicting a schematic structure example of a memory cell of ReRAM. A memory cell MC can be configured by combining a variable resistance element VR depicted in FIG. 1 and a selection transistor TR which is formed of a Metal-Oxide Semiconductor (MOS) transistor. The selection transistor TR controls whether to apply a potential difference between a bit line BL and a plate line PL to the variable resistance element VR or shut off it.

One terminal of the variable resistance element VR is coupled to the plate line PL and the other terminal thereof is coupled via the selection transistor TR to the bit line BL. A gate of the selection transistor TR is coupled to a word line WL. By making either the potential of the bit line BL or the potential of the plate line PL higher than the other, the polarity of the variable resistance element VR can be switched over.

Although it is not determinative whether the metal layer M1 or the metal layer M2 is coupled to the plate line PL, descriptions will be provided below, assuming that the metal layer M2 is coupled to the plate line PL. Although it is not determinative whether the selection transistor TR should be N-channel type or P-channel type, descriptions will be provided below, assuming that the transistor is N-channel type in which source-drain conduction occurs by applying a positive voltage to the gate. In the case of a P-channel type transistor, source-drain conduction occurs by applying a negative voltage to the gate.

Figure 3:
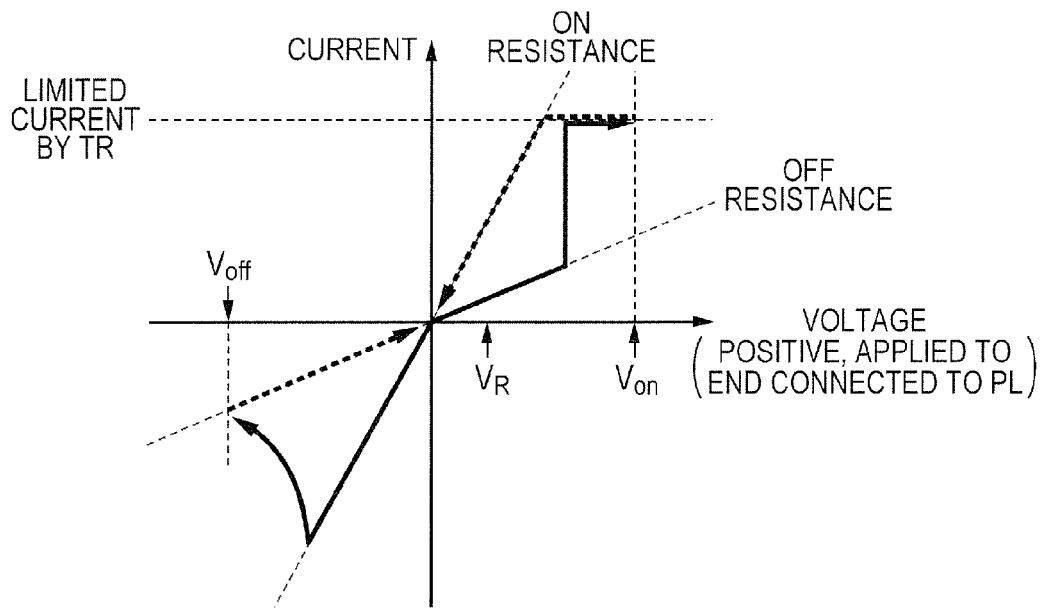
FIG. 3 is a diagram depicting an example of the characteristic of the variable resistance element.

FIG. 3 is a diagram depicting an example of the characteristic of the variable resistance element VR in a memory cell MC. This diagram represents that the VR has the following characteristic: when the VR is in a high resistance (Off resistance) state, application of a positive voltage ($V_{on}$) to its end (metal layer M2) coupled to the plate line PL turns the VR into a low resistance (On resistance) state; and, in this state, application of a positive voltage ($V_{off}$) to its end coupled via the selection transistor TR to the bit line BL turns the VR into the high resistance (Off resistance) state. By keeping the high resistance state (Off state) and the low resistance state (On state), the cell stores information in a non-volatile manner. Even after the VR is turned into the low resistance state by the application of $V_{on}$, current through the VR is limited to a predetermined limited current by the selection transistor TR.

Meanwhile, reading a resistance state is performed by applying a positive voltage for reading ($V_R$ which is larger than $V_{on}$) to the end coupled to the plate line PL and detecting a current flowing through the VR without changing the resistance state of the variable resistance element VR.

Figure 4:
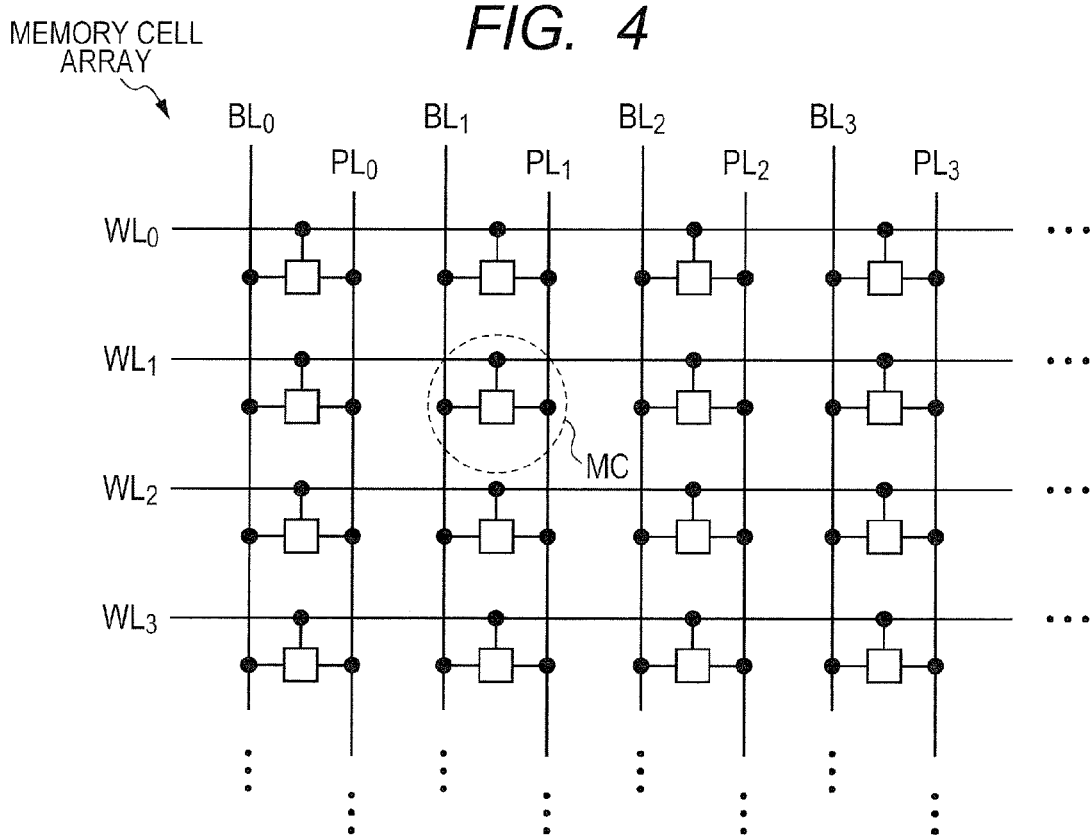
FIG. 4 is a diagram depicting a schematic structure example of a memory cell array of ReRAM.

FIG. 4 is a diagram depicting a schematic structure example of a memory cell array of ReRAM. A memory cell array MCA can be configured by arranging memory cells MCs, one of which was depicted in FIG. 2, in a matrix. An example of a memory cell array MCA depicted in FIG. 4 is formed of a matrix of 4 rows×4 columns, having a storage capacity of 16 bits; a larger storage capacity can be realized by increasing the number of rows and columns of the array appropriately.

The memory cells MC each are coupled to nodes where word lines $WL_0$ to $WL_3$ intersect with bit lines $BL_0$ to $BL_3$ and plate lines $PL_0$ to $PL_3$. All the word lines $WL_0$ to $WL_3$, bit lines $BL_0$ to $BL_3$, and plate lines $PL_0$ to $PL_3$ are coupled to control circuits, not depicted, in the periphery of the memory cell array MCA. For example, the word lines $WL_0$ to $WL_3$ are coupled to a word line control circuit, not depicted, on the left side in the drawing of the memory cell array MCA. The bit lines $BL_0$ to $BL_3$ are coupled to a bit line control circuit, not depicted, on the upper side in the drawing. Likewise, the plate lines $PL_0$ to $PL_3$ are coupled to a plate line control circuit, not depicted, on the upper side in the drawing.

Control circuitry included of the above-mentioned respective control circuits writes a memory cell by applying a voltage to the appropriate word line WL, bit line BL, and plate line PL, thus turning the desired memory cell MC into a high or low resistance state. The control circuitry reads a memory cell by detecting a current flowing through the appropriate bit line BL or plate line PL and deciding whether the desired memory cell MC is placed in a high or low resistance state.

FIG. 5 is a diagram representing patterns of voltage to be applied to each line when writing or reading is performed. For example, to write a memory cell MC surrounded by a dotted circle to turn it into an On state, a word line $WL_1$ and a plate line $PL_1$ should be placed at a high potential ($V_{w1}$ and $V_{on}$) and other word lines $WL_0$, $WL_2$, and $WL_3$ and plate lines $PL_0$, $PL_2$, and $PL_3$, and all bit lines $BL_0$ to $BL_3$ should be placed at a zero potential (GND). Inversely, to write the memory cell MC surrounded by a dotted circle to turn it into an Off state, the word line $WL_1$ and a bit line $BL_1$ should be placed at a high potential ($V_{w2}$ and $V_{off}$) and other word lines $WL_0$, $WL_2$, and $WL_3$ and bit lines $BL_0$, $BL_2$, and $BL_3$, and all plate lines $PL_0$ to $PL_3$ should be placed at a zero potential (GND).

To read whether the memory cell MC surrounded by a dotted circle is placed in an On state or Off state, word lines $WL_0$, $WL_2$, and $WL_3$ and plate lines $PL_0$, $PL_2$, and $PL_3$ other than the word line $WL_1$ and the plate line $PL_1$ and all bit lines $BL_0$ to $BL_3$ should be placed at a zero potential (GND) and the word line $WL_1$ should be placed at a high potential ($V_{w3}$). Then, a voltage (VR) which is sufficiently lower than the voltage applied for writing should be applied to the plate line $PL_1$ and a current flowing through the bit line $BL_1$ or plate line $PL_1$ should be detected.

During an operation described above, in memory cells MCs coupled to word lines other than the word line $WL_1$, the selection transistors TR are non-conductive and no voltage is applied to the variable resistance elements VR. Besides, in memory cells MCs coupled to bit lines and plate lines other than the bit line $BL_1$ and the plate line $PL_1$, no voltage is applied to the variable resistance elements VR, since the bit lines $BL_0$, $BL_2$, and $BL_3$ and the plate lines $PL_0$, $PL_2$, and $PL_3$ are placed at the same potential. Hence, only the memory cell MC surrounded by a dotted circle is written or read. Writing and reading other memory cells MCs can be performed in the same way as described above.

FIG. 6 is a diagram depicting an example of a waveform of a voltage which is ordinarily applied when verify writing is performed to turn a memory cell MC into an OFF state. To turn the variable resistance element VR in the memory cell MC depicted in FIG. 2 into a high resistance state (Off state), a higher voltage is applied to the end coupled to the bit line BL, of the variable resistance element VR, than the voltage at the end coupled to the plate line PL. Usually, a pulse-form voltage (Off writing pulse $P_{off}$) as depicted is applied once. To do this, for example, with the end coupled to the bit line BL placed at a higher potential than the end coupled to the plate line PL, the selection transistor TR should be made conductive by increasing the potential of the word line WL for a predetermined period ($t_{off}$). Alternatively, with the selection transistor TR made conductive by increasing the potential of the word line WL, the pulse voltage to place the end coupled to the bit line BL at a positive potential should be applied between the bit line BL and the plate line PL.

Verify writing is performed as described below. After applying the Off writing pulse $P_{off}$, the control circuitry applies a reading pulse $P_R$ for verification and detects a current, thereby reading the resistance of the variable resistance element VR. Then, the control circuit decides whether or not writing is successful, according to the thus read value of resistance. If the value of resistance meets a predetermined criterion (the value is not less than a predetermined value), the control circuitry decides that the first time attempt is successful and terminates the writing process.

Otherwise, if the value of resistance of the variable resistance element VR does not meet the predetermined criterion (the value is less than the predetermined value), the control circuitry decides that the first time attempt is failed. After applying the Off writing pulse $P_{off}$ again as a second time attempt, the control circuitry applies the reading pulse $P_R$ and reads the resistance of the variable resistance element VR, and decides whether writing is successful depending on whether the resistance value meets the predetermined criterion. If writing is yet unsuccessful, the control circuitry repeats attempts until writing by applying the Off writing pulse $P_{off}$ is decided to be successful, for example, by a predetermined number of times set as a maximum.

Figure 8:
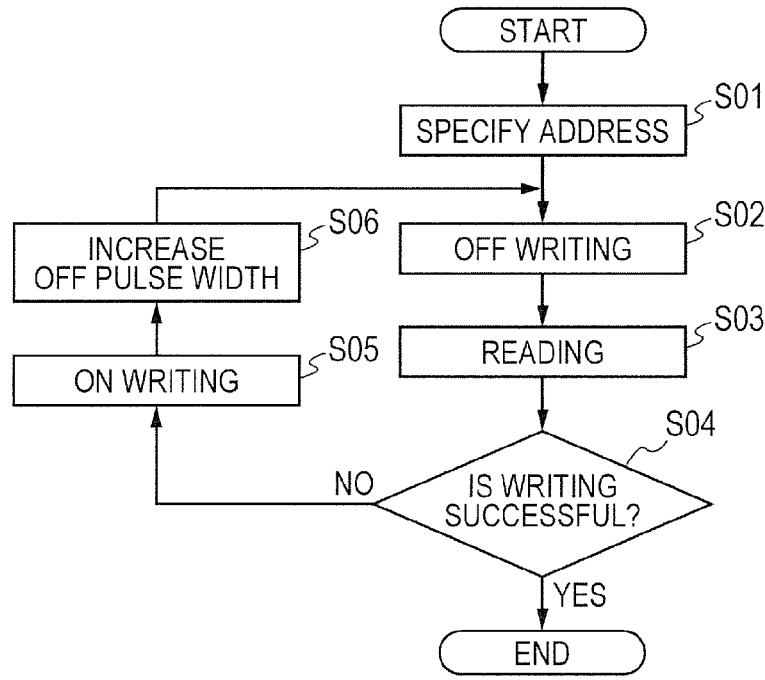
FIG. 8 is a flowchart illustrating an example of a verify writing procedure according to the first embodiment of the present invention.

FIG. 7 is a diagram depicting an example of a waveform of a voltage which is applied when verify writing is performed to turn a memory cell MC into an OFF state, according to a first embodiment. FIG. 8 is a flowchart illustrating an example of a verify writing procedure according to the present embodiment.

In the present embodiment, for example, as depicted in FIG. 7, the address of a memory cell MC into which information will be written is first specified (step S01 in FIG. 8) and, as a first time attempt, the control circuitry applies an Off writing pulse $P_{off}$ with a pulse width $t_{off1}$ to the specified memory cell MC, thus executing writing to turn the variable resistance element VR into an Off state (S02). Then, the control circuitry applies a reading pulse $P_R$ for verification and detects a current, thereby reading the resistance of the variable resistance element VR (S03). After that, the control circuitry decides whether or not writing is successful, according to the thus read value of resistance (S04). That is, if the value of resistance meets a predetermined criterion (the value is not less than a predetermined value), the control circuitry decides that the first time attempt is successful and terminates the writing process.

Otherwise, if the value of resistance of the variable resistance element VR does not meet the predetermined criterion (the value is less than the predetermined value), the control circuitry decides that the first time attempt is failed. The control circuitry applies an On writing pulse $P_{on}$ with a pulse width $t_{on}$ (S05) to decrease the resistance of the variable resistance element VR once. Then, the control circuitry sets the pulse width of the Off writing pulse $P_{off}$ to $t_{off2}$ (which is larger than $t_{off1}$) (S06). In this state, as a second time attempt, the control circuitry executes a series of processing operations as follows: Off writing, again (S02), verify reading (S03), and deciding whether writing is successful according to the resistance value (S04).

The control circuitry terminates the writing process, if having decided that Off writing is successful. But, if having decided that Off writing is failed, the control circuitry re-executes On writing (S05) with the On writing pulse $P_{on}$ whose pulse width and voltage remain unchanged. After that, the control circuitry further increases the pulse width to $t_{off3}$ which is larger than $t_{off2}$ (S06) and executes verify writing (S02 thru S04). The control circuitry repeats a series of processing operations described above until Off writing is successful (the resistance value becomes equal to or more than the predetermined value).

The reason why the way of verify writing in which the pulse width of the Off writing pulse $P_{off}$ is gradually increased is effective is as follows: because of characteristic variation of memory cells MC, each including a variable resistance element VR, rewriting energy required to set the memory cells MC in a high resistance state differs from one cell to another.

Figure 9:
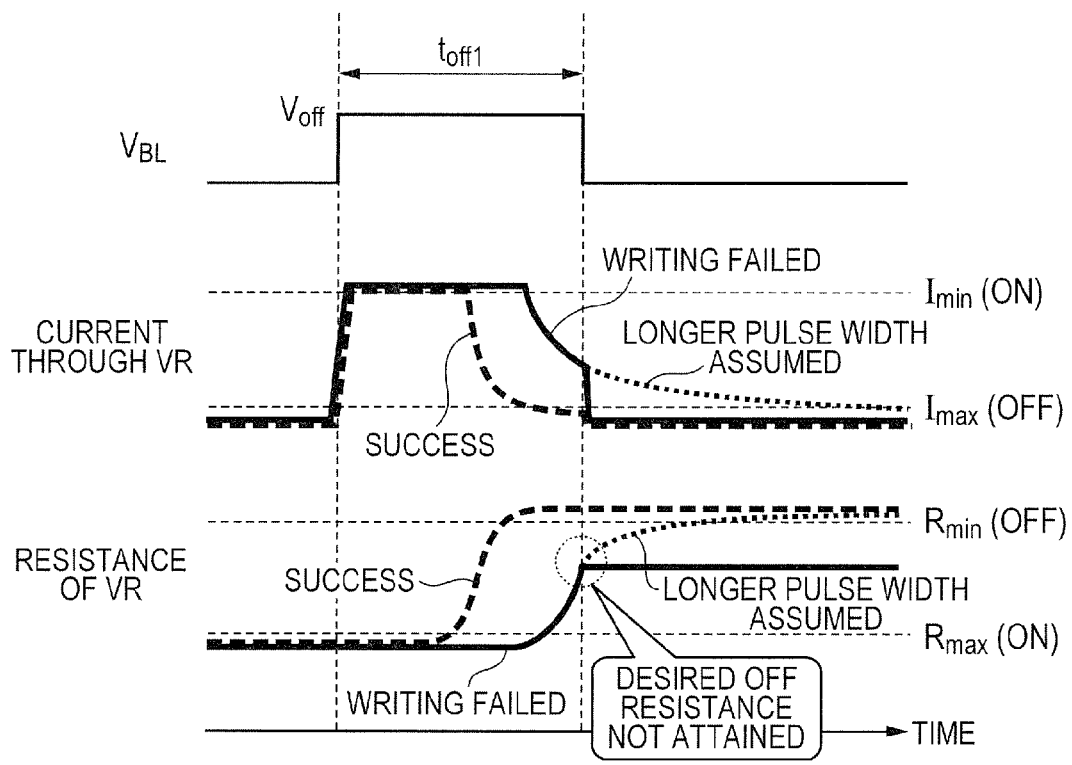
FIG. 9 is a diagram conceptually illustrating an instance where Off writing is failed due to characteristic variation of memory cells MC.

FIG. 9 is a diagram conceptually illustrating an instance where Off writing is failed due to characteristic variation of memory cells MC. This diagram illustrates change over time of a voltage $V_{BL}$ which is applied to the end coupled to the bit line BL (i.e., Off writing pulse $P_{off}$ when applied) in the top row, current through VR which flows through the variable resistance element VR in the middle row, and the value of resistance of VR, namely, a variable resistance element VR in the bottom row. $I_{min}$(On) and $I_{max}$(Off) of the current through VR respectively denote a minimum value of current targeted in an On state (low resistance state) and a maximum value of current targeted in an Off state (high resistance state). $R_{min}$(Off) and $R_{max}$(On) of the resistance of VR respectively denote a minimum value of resistance targeted in the Off state (high resistance state) and a maximum value of resistance targeted in the On state (low resistance state).

In the diagram, a dashed line depicts the characteristic of a memory cell MC that can be set in the high resistance state successfully with relatively small energy, indicating that the value of resistance of VR has reached the desired Off resistance ($R_{min}$(Off)) during the application of the Off writing pulse $P_{off}$ with a pulse width $t_{off1}$. On the other hand, a solid line depicts the characteristic of a memory cell for which large energy is supposed to be needed to set it in the high resistance state, indicating that the application of the Off writing pulse $P_{off}$ with a pulse width $t_{off1}$ terminates when the resistance value has not yet reached the desired Off resistance ($R_{min}$(Off)), since the value of resistance of VR starts to increase late. Besides, a dotted line in the diagram depicts how the MC behaves, assuming that the pulse width of the Off writing pulse $P_{off}$ is longer than $t_{off1}$; this shows that it takes longer until the MC is set in the high resistance state.

For such a memory cell MC, it is decided that rewriting it is needed. As depicted in FIG. 9, in most cases, what causes an instance in which writing is failed and rewriting is needed is that Off writing results in only an intermediate resistance value, i.e., "the resistance value is made higher than On resistance ($R_{max}$(On)), but is lower than the desired Off resistance ($R_{min}$(Off)). In this case, setting the MC in the high resistance state would not be accomplished easily even by applying an Off writing pulse $P_{off}$ whose pulse width was solely made longer in a rewriting process.

Figure 10:
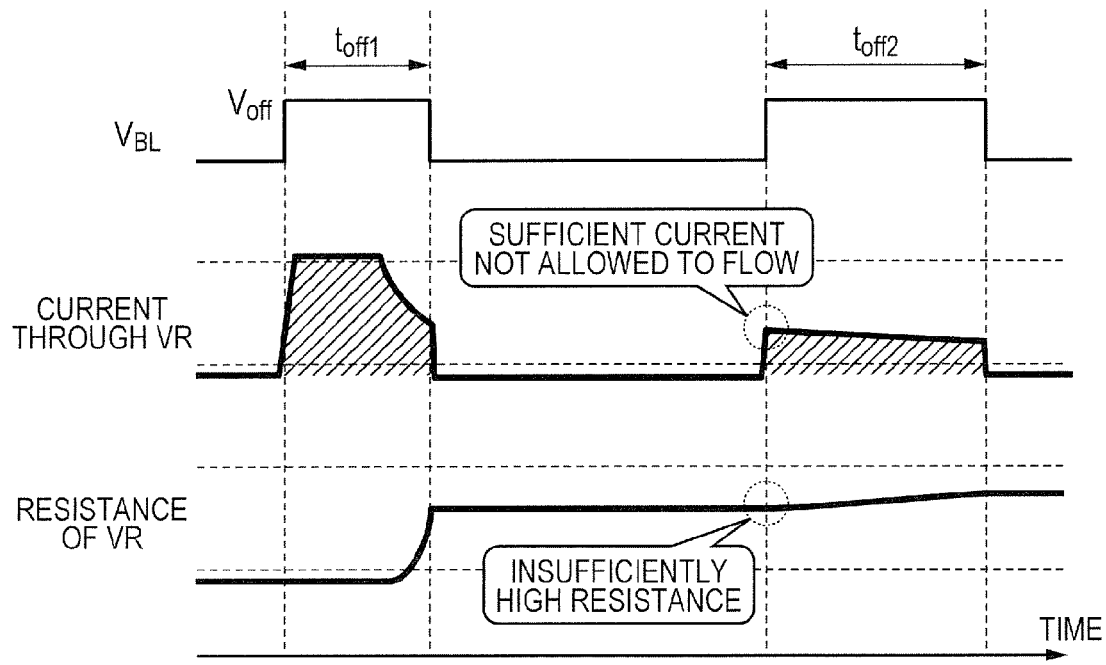
FIG. 10 is a diagram depicting an example of the state of a variable resistance element VR that is assumed in a case where a writing pulse of opposite polarity is not applied before rewriting is executed.

FIG. 10 is a diagram depicting an example of the state of a variable resistance element VR that is assumed in a case where a writing pulse of opposite polarity is not applied before rewriting is executed. In the above case, even if the pulse width of the Off writing pulse $P_{off}$ is made longer ($t_{off2}>t_{off1}$) in a subsequent verify writing attempt, the current flowing through the variable resistance element VR decreases, even though the same voltage is applied, since the value of resistance of the variable resistance element VR has already increased to an intermediate resistance value. Hence, even if the pulse width is made longer, driving force for increasing the resistance (that is, energy expressed by current×time, which is represented by a shaded area in the diagram) is not supplied up to a required quantity and the VR is placed in a condition where its resistance value is hard to increase.

Figure 11:
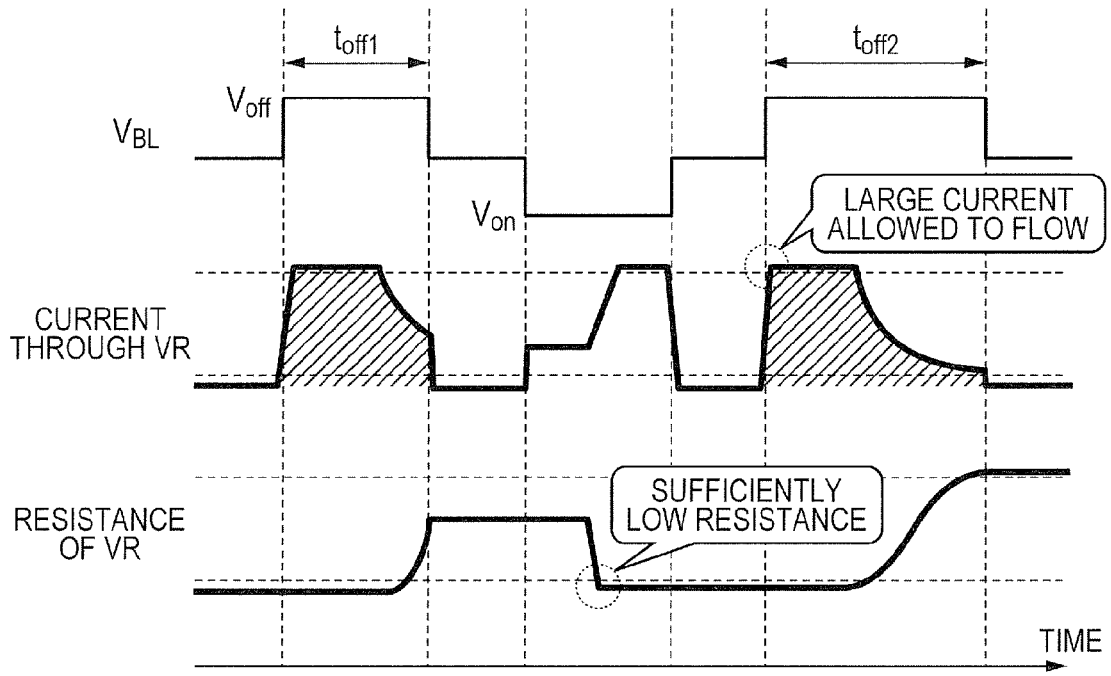
FIG. 11 is a diagram depicting an example of the state of a variable resistance element VR that is assumed in a case where a writing pulse of opposite polarity is applied before rewriting is executed, according to the first embodiment of the present invention.

FIG. 11 is a diagram depicting an example of the state of a variable resistance element VR that is assumed in a case where a writing pulse of opposite polarity is applied before rewriting is executed, according to the present embodiment. To avoid the condition where the resistance value is not increased sufficiently even if the rewriting pulse width is made longer, as depicted in FIG. 10, the control circuitry executes On writing once before rewriting, as depicted in FIG. 11 (at this time, the current through VR becomes to have opposite polarity, but it is depicted in absolute value in the diagram). This returns the variable resistance element VR to the low resistance state (On state), in other words, resets the VR and creates a condition where more current is allowed to flow through the VR. Under this condition, executing Off writing with the pulse with an increased pulse width allows a sufficiently large current to flow through the VR and enables providing more driving power for Off writing (represented by a shaded area in the diagram) than in the preceding attempt. Thus, this increases the possibility of successful verify rewriting and enables efficiency.

In the present embodiment, an On writing pulse for resetting the VR (reset pulse) is required to be the same pulse, every time the VR is reset. With a constant low resistance state (On state) created by applying a constant On writing pulse, the time during which the Off writing pulse is applied is made longer gradually. This can increase the probability in which the VR is set in the high resistance state (Off state), as attempts are repeated, and makes it possible to execute verify rewriting efficiently.

As in related art, for example, in a case of extending the On writing pulse width or increasing the On writing pulse voltage with an increase in the Off writing pulse width at each attempt, excessive resetting is performed; this changes the condition before Off writing is executed to a condition where the VR is hard to set in the Off state (more energy is required to increase the resistance of the VR). Consequently, the effect of extending the Off writing pulse width at each attempt is cancelled by excessive resetting, which may result in that the probability in which the VR is set in the Off state is hard to increase and verify rewriting cannot be executed efficiently.

Applying an Off writing pulse with a too long width to a memory cell MC for which Off writing is successful with an Off writing pulse with a short width may make a decrease in the success rate at a subsequent On writing. Hence, it is preferable to make the pulse width of an Off writing pulse as short as possible at the first time attempt to set the VR in the high resistance state with minimum necessary driving power. In particular, the pulse width can be set to, e.g., approx. 20 nsec. As the Off writing pulse width at a second time or subsequent attempt, a longer pulse width than in the preceding attempt can be selected by any method. For example, a method of incrementing the pulse width by a constant time in arithmetic progression and a method of incrementing the pulse width by a constant factor in geometric progression, among others, are conceivable.

The former method allows the pulse width to increase in small steps overall and, therefore, has a merit in which it enables detailed control in applying a writing pulse with a minimum necessary pulse width to each memory cell MC, whereas having a demerit in which, for a memory cell MC for which a long pulse width is required, verify rewriting it has to be repeated many times and, consequently, it may take long to write it. Conversely, the latter method enables verify writing even a memory cell MC for which a long pulse width is required by fewer times, that is, writing it for a relatively short period of time. On the other hand, an Off writing pulse with a too long pulse width may be applied to some of the memory cells MC. Therefore, in implementation, it is preferable to select an optimal method appropriately, depending on characteristic variation of actual variable resistance elements VR.

The example described above is an instance in which the Off writing pulse width is increased each time the Off writing pulse is applied once. Alternatively, it is also possible to repeat verify writing without changing the Off writing pulse width until writing has been attempted by a predetermined number of times and increment the pulse width, if writing is not performed properly, when attempted by the predetermined number of times.

For example, the control circuitry may apply an Off writing pulse with the same pulse width at the first and second time attempts and apply the Off writing pulse with a different pulse width at a third time or subsequent attempt. Increasing the pulse width may be adaptable such that, for example, the pulse width at the second time attempt is made longer than that at the first time attempt, the pulse width at the third time attempt is the same as that at the second time, and the pulse width at a fourth time attempt is made longer than that at the second and third time attempts. There is a possibility in which writing a bit that is almost fixed to a resistance state more than threshold resistance for writing may be succeeded by reattempt using the same pulse width. If doing so is possible, Off writing can be completed using minimum necessary energy for writing. Such adaptation in increasing the pulse width is not limited to the present embodiment and can also be applied to other embodiments likewise.

Figure 12:
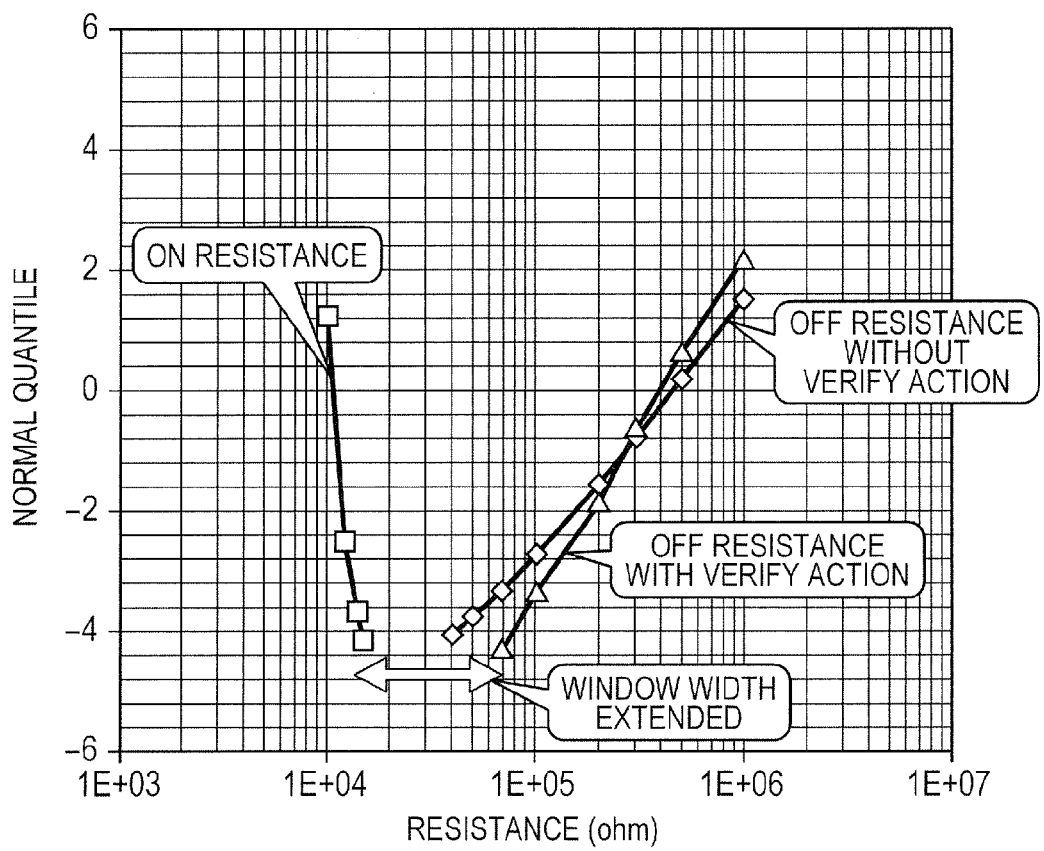
FIG. 12 is a diagram depicting an example of the effect of applying the verify writing method according to the first embodiment of the present invention to Off writing.

FIG. 12 is a diagram depicting an example of the effect of applying the verify writing method according to the present embodiment to Off writing. This diagram represents cumulative frequency distribution of On resistance and OFF resistance values resulting from ordinary On writing and Off writing without verify action performed for multiple memory cells as well as cumulative frequency distribution of On resistance and OFF resistance values resulting from ordinary On writing and Off writing according to the present embodiment, that is, verify writing performed in which Off writing is performed with the pulse whose width is increased and in combination with a reset pulse. In a process of Off writing without verify action, an Off writing pulse with a pulse width of 100 nsec is applied only once. In a verify writing process, an Off writing pulse is applied, while its pulse width is increased gradually in eight steps into which a range of 20 nsec to 3 μsec is divided. On writing pulse conditions for On writing are the same.

As presented in FIG. 12, by the application of verify writing according to the present invention, there is a decrease in the number of memory cells MCs with a higher Off resistance value and of memory cells MC with a lower Off resistance value across all MCs and a condition occurs where the resistance values are distributed over a smaller range (showing a steeper distribution gradient) as compared with an instance where verify writing is not performed. Also, verify writing has no influence on distribution of On resistance values. In consequence, a memory window extends which is a difference between a maximum value in distribution of ON resistance values and a minimum value in distribution of Off resistance values and it would become possible to prevent the occurrence of a faulty memory cell MC which is not set in a sufficiently low resistance state during Off writing.

Figure 13:
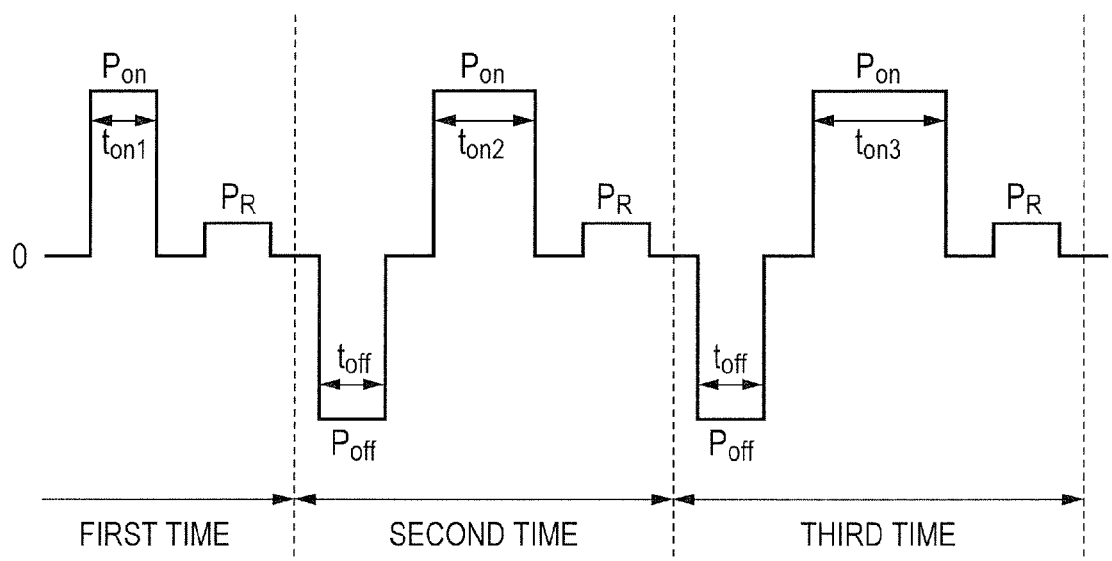
FIG. 13 is a diagram depicting an example of a waveform of a voltage which is applied when verify writing is performed to turn a memory cell into an On state, according to the first embodiment of the present invention.

Although an instance of Off writing has been described by way of example in the present embodiment, application to On writing is also possible. FIG. 13 is a diagram depicting an example of a waveform of a voltage which is applied when verify writing is performed to turn a memory cell MC into an On state, according to the present embodiment. As depicted, in a process of verify writing with an On writing pulse $P_{on}$ whose pulse width is increased gradually from $t_{on1}$ to $t_{on2}$, to $t_{on3}$, and so on, by applying the same Off writing pulse $P_{off}$ to reset the VR before applying the On writing pulse Pon at a second time or subsequent attempt, the same effect can be obtained.

More specifically, verify On writing with the pulse width being increased gradually can be performed, for example, as follows: in an inverse manner to control in Off writing, the bit line BL is replaced with the plate line PL as a signal line supplying a writing pulse and the control circuitry appropriately adjusts a voltage which is applied to the word line WL without changing the condition for applying the reading pulse $P_R$ for verification.

As set forth above, according to the ReRAM of the first embodiment, the control circuitry applies the On writing pulse $P_{on}$ once before rewriting in the process of verify rewriting with the pulse width of the Off writing pulse $P_{off}$ being increased gradually. Balance when Off writing is executed is changed appropriately by keeping the pulse width and voltage of the On writing pulse $P_{on}$ constant. Thereby, it would become possible to set the ReRAM cells in a sufficiently high or low resistance state, while preventing excessive writing, and to perform optimal Off writing efficiently.

Second Embodiment

Figure 14:
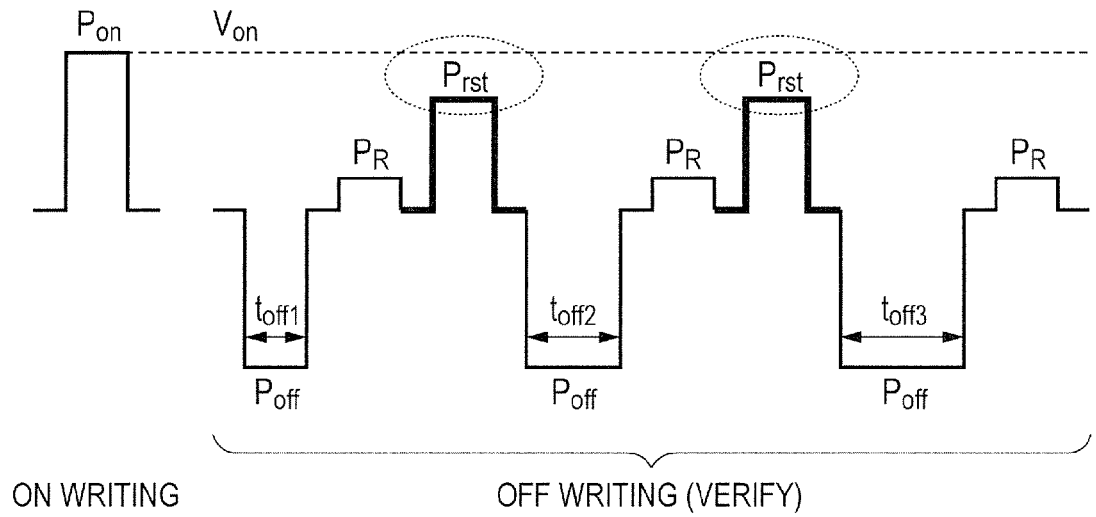
FIG. 14 is a diagram depicting an example of a waveform of a voltage which is applied when verify writing is performed to turn a memory cell into an Off state, according to a second embodiment of the present invention.

FIG. 14 is a diagram depicting an example of a waveform of a voltage which is applied when verify writing is performed to turn a memory cell into an Off state, according to a second embodiment. In the present embodiment, in a process of verify Off writing using a pulse similar to that depicted in FIG. 7 for the first embodiment, after verification, a reset pulse $P_{rst}$ is applied before executing Off writing, as depicted. The reset pulse $P_{rst}$ has the same polarity as the polarity of an ordinarily used On writing pulse $P_{on}$ and its voltage is lower than the voltage $V_{on}$ of the On writing pulse $P_{on}$. Thereby, as in the first embodiment, it is possible to reach a desired Off resistance value through fewer times of verify action and the efficiency of verify Off writing can be improved.

Figure 15:
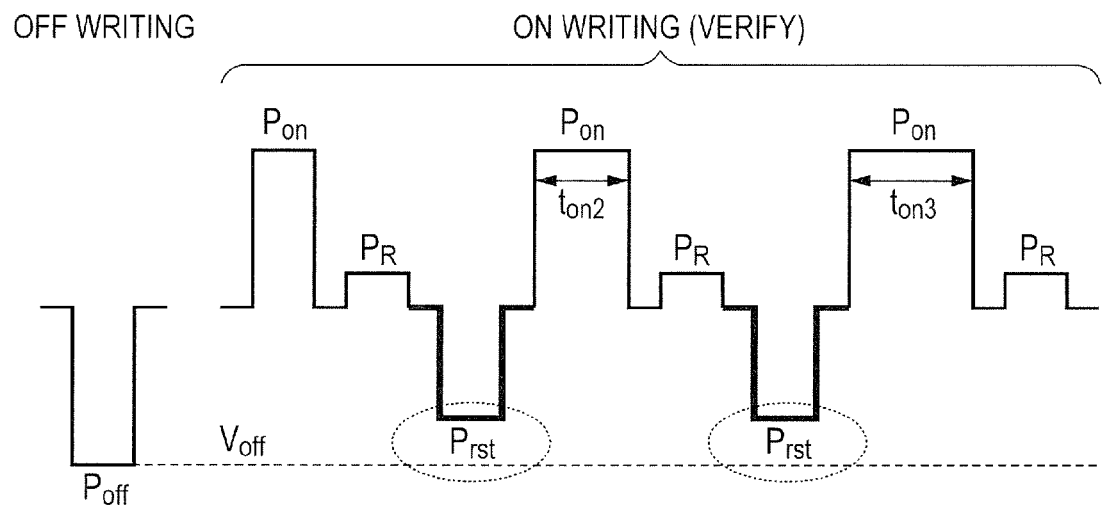
FIG. 15 is a diagram depicting an example of a waveform of a voltage which is applied when verify writing is performed to turn a memory cell into an On state, according to the second embodiment of the present invention.

FIG. 15 is a diagram depicting an example of a waveform of a voltage which is applied when verify writing is performed to turn a memory cell into an On state, according to the second embodiment. In a process of verify On writing using a pulse similar to that depicted in FIG. 13 for the first embodiment, after verification, a reset pulse $P_{rst}$ is applied before executing On writing, as depicted. The voltage of the reset pulse $P_{rst}$ is lower than the voltage $V_{off}$ of an ordinarily used Off writing pulse $P_{off}$. Thereby, the same effect can be obtained.

Although the reset pulse $P_{rst}$ is weakened by making the voltage of the reset pulse $P_{rst}$ lower than the voltage $V_{on}$ of the On writing pulse $P_{on}$ (or the voltage $V_{off}$ of the Off writing pulse $P_{off}$) in the present embodiment, the reset pulse $P_{rst}$ may be weakened by decreasing its pulse width.

Third Embodiment

Figure 16:
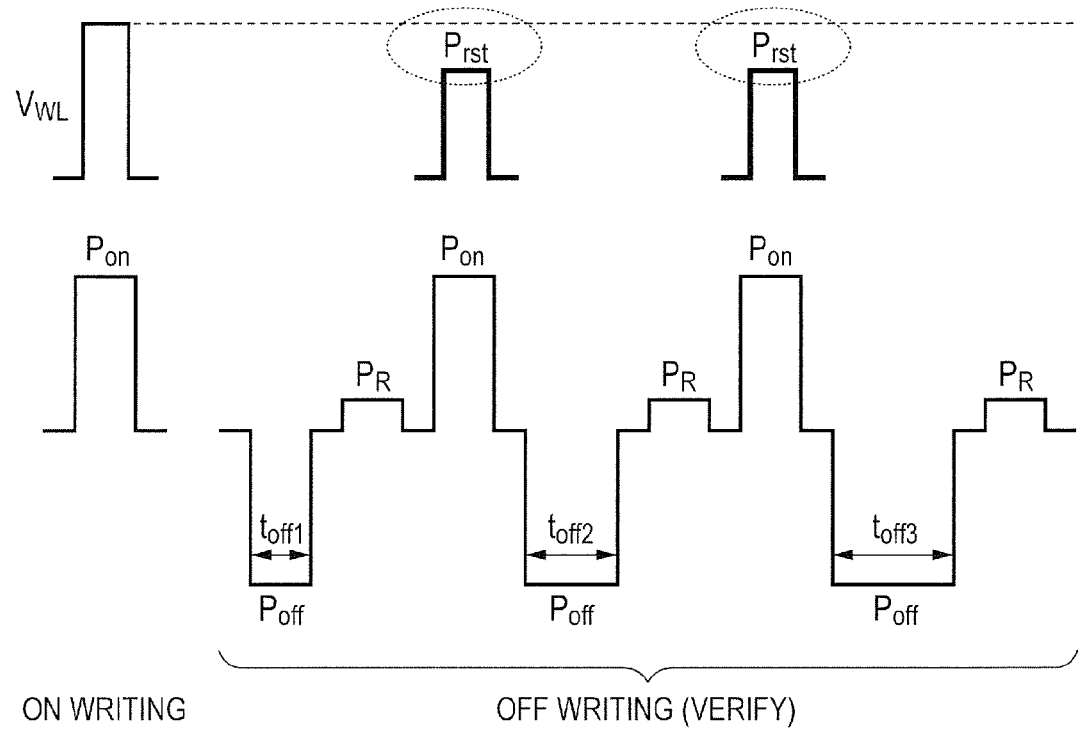
FIG. 16 is a diagram depicting an example of a waveform of a voltage which is applied when verify writing is performed to turn a memory cell into an Off state, according to a third embodiment of the present invention.

FIG. 16 is a diagram depicting an example of a waveform of a voltage which is applied when verify writing is performed to turn a memory cell into an Off state, according to a third embodiment. In the present embodiment, in a process of verify Off writing using a pulse similar to that depicted in FIG. 7 for the first embodiment, a reset pulse $P_{rst}$ of the same polarity as the polarity of the On writing pulse $P_{on}$ is applied, as depicted. When the reset pulse $P_{rst}$ is applied, a voltage to be applied to the word line WL is lower than the voltage $V_{WL}$ that is applied to the word line WL when ordinary Off writing is performed. Thereby, as in the first embodiment, it is possible to reach a desired Off resistance value through fewer times of verify action and the efficiency of verify Off writing can be improved. Application to verify On writing is also possible and the same effect can be obtained.

Controlling the voltage to be applied to the word line WL is controlling the gate voltage of the selection transistor TR and is equivalent to controlling the current required to switch over the resistance state of the variable resistance element VR. Therefore, even by controlling the amount of current from a current source external to the memory cell array instead of the voltage to be applied to the word line, a configuration can be provided to obtain the same effect.

Fourth Embodiment

Figure 17:
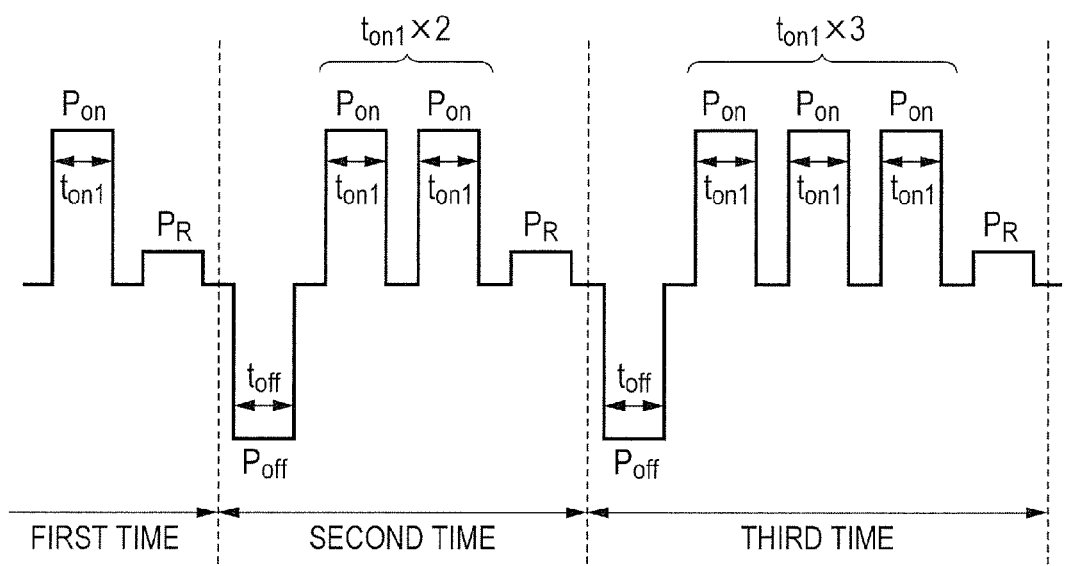
FIG. 17 is a diagram depicting an example of a waveform of a voltage which is applied when verify writing is performed to turn a memory cell into an On state, according to a fourth embodiment of the present invention.

FIG. 17 is a diagram depicting an example of a waveform of a voltage which is applied when verify writing is performed to turn a memory cell MC into an On state, according to a fourth embodiment. In the present embodiment, in a process of verify On writing using a pulse similar to that depicted in FIG. 13 for the first embodiment, by increasing the number of times the same On writing pulse $P_{on}$ is continuously applied, as depicted, instead of increasing the pulse width of the On writing pulse $P_{on}$, a configuration is provided to obtain the same effect. Basically, the configuration of the present embodiment can only be applied to On writing.

According to the ReRAM of the fourth embodiment, the control circuitry continuously applies the On writing pulse $P_{on}$ with a minimum pulse width without increasing the pulse width of the On writing pulse $P_{on}$. It is not required to set several pulse widths of the On writing pulse $P_{on}$ and the configuration can be simplified. Besides, the variable resistance element VR can be prevented from heating excessively and elaborative control can be performed, lessening variation of ON resistance values after the execution of On writing.

Fifth Embodiment

Figure 18:
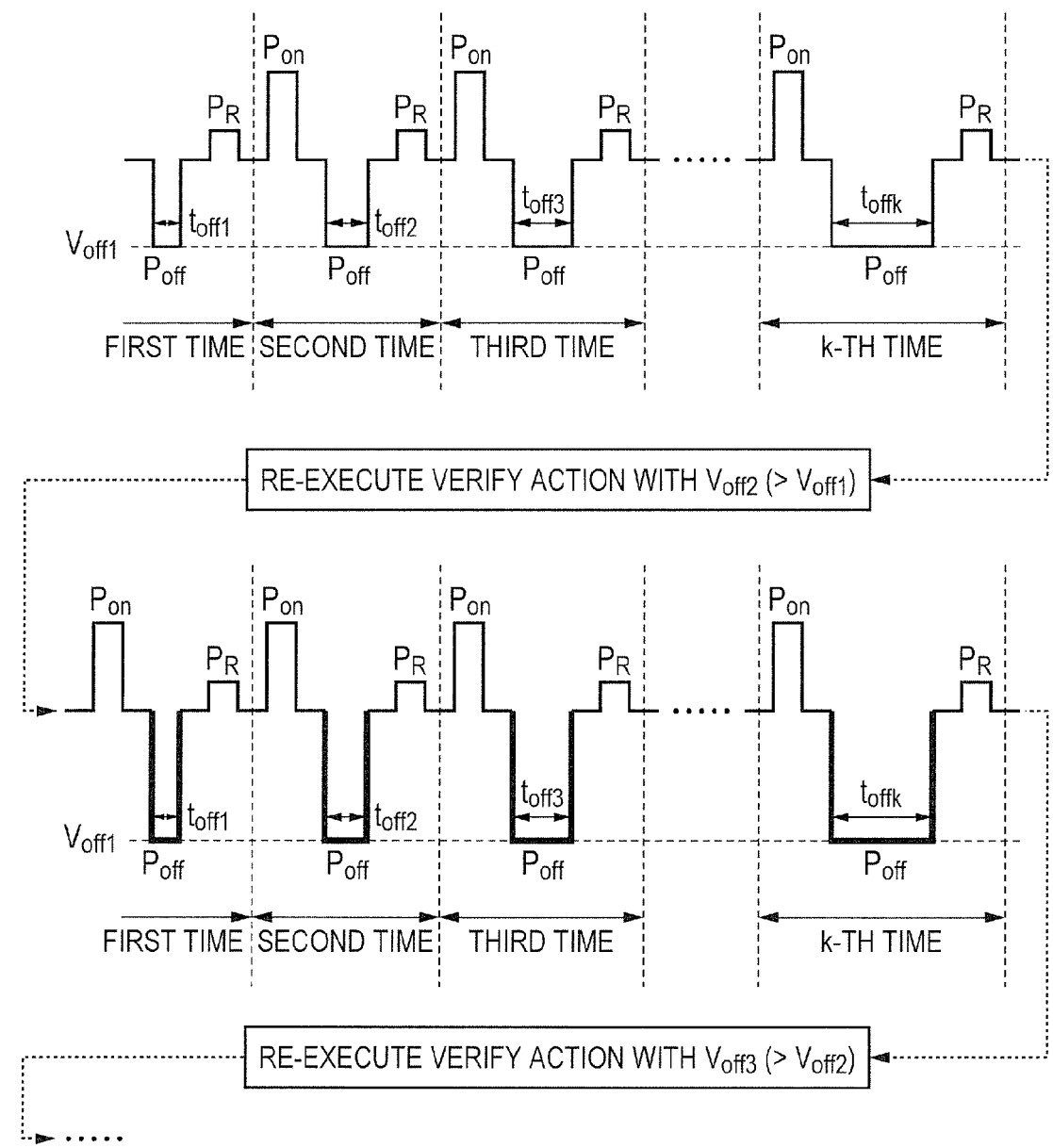
FIG. 18 is a diagram depicting an example of a waveform of a voltage which is applied when verify writing is performed to turn a memory cell MC into an Off state, according to a fifth embodiment of the present invention.
Figure 19:
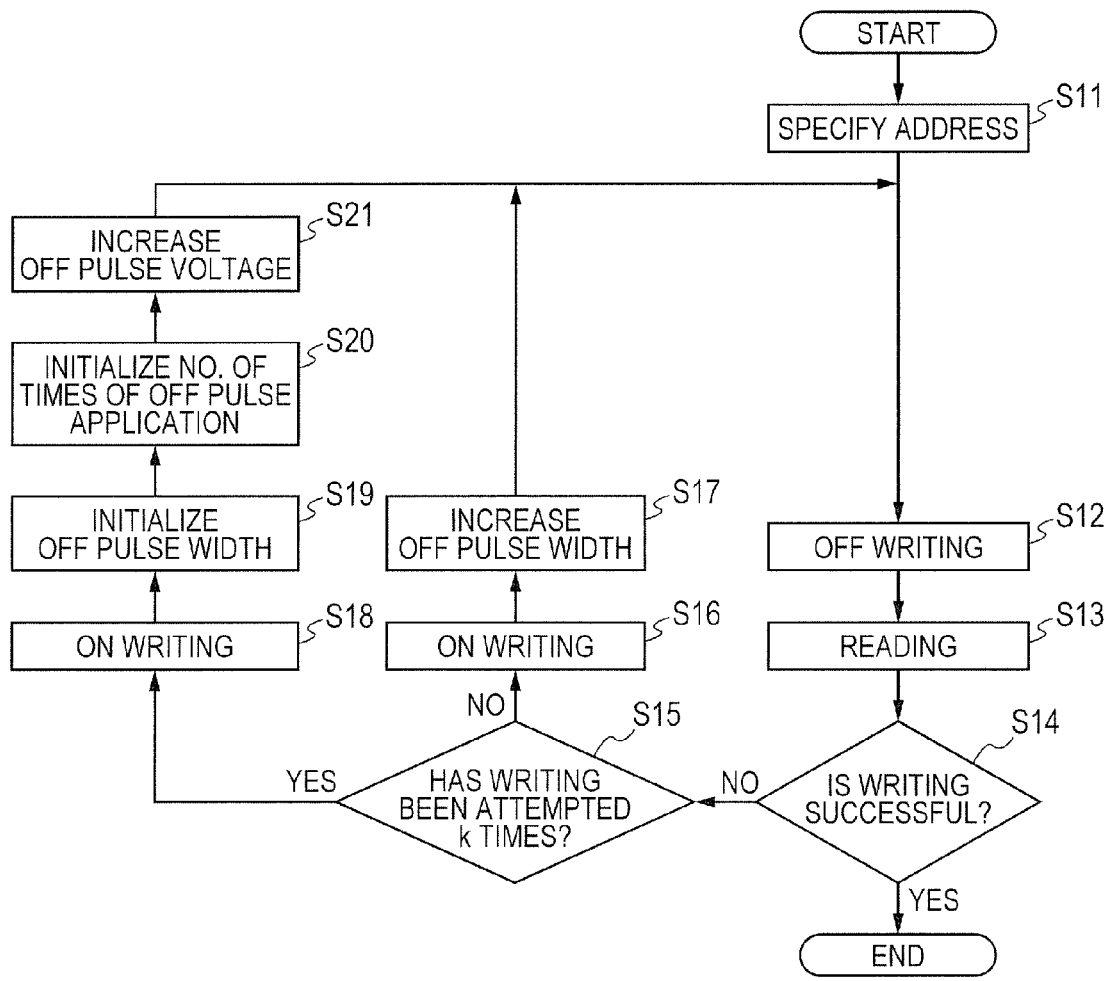
FIG. 19 is a flowchart illustrating an example of a verify writing procedure according to the fifth embodiment of the present invention.

FIG. 18 is a diagram depicting an example of a waveform of a voltage which is applied when verify writing is performed to turn a memory cell MC into an Off state, according to a fifth embodiment. FIG. 19 is a flowchart illustrating an example of a verify writing procedure according to the present embodiment. In the present embodiment, as an example of combination of verify writing which is executed by gradually increasing the pulse width of the Off writing pulse $P_{off}$ which is the same as that depicted in FIG. 7 for the first embodiment with verify writing using a parameter other than the pulse width, presented is an instance of the combination with verify writing which is executed by gradually increasing the amplitude of the voltage of the Off writing pulse $P_{off}$.

The address of a memory cell MC into which information will be written is first specified (step S11 in FIG. 19) and the control circuitry executes verify Off writing; i.e., to the target memory cell MC, the control circuitry applies the Off writing pulse $P_{off}$ whose voltage is labeled $V_{off1}$, as presented in the top row of FIG. 18, and gradually increases the pulse width of the Off writing pulse $P_{off}$ in the same way as depicted and illustrated in FIG. 7 and FIG. 8 for the first embodiment (S12 thru S17). Then, if writing is unsuccessful, as decided at step S14, that is, the resistance value does not reach a predetermined Off resistance value, the control circuitry decides whether or not writing has been attempted by a predetermined upper limit number of times (k times in the present embodiment) (S15).

If it is decided that writing has been attempted by the upper limit number of times k, but the resistance value does not reach the predetermined Off resistance value, the control circuitry sets the voltage of the Off writing pulse $P_{off}$ to a higher voltage $V_{off2}$ (which is larger than $V_{off1}$), as presented in the middle row of FIG. 18, and re-executes verify Off writing, while gradually increasing the pulse width of the Off writing pulse $P_{off}$ from the minimum width $t_{off1}$. That is, after applying the On writing pulse $P_{on}$ to reset the VR (S18), the control circuitry initializes the pulse width of the Off writing pulse $P_{off}$ to $t_{off1}$ (S19) and initializes the number of times of application to zero (S20). Then, the control circuitry increases the amplitude of the voltage of the Off writing pulse $P_{off}$ to $V_{off2}$ (S21), returns to step 12, and repeats verify Off writing, while gradually increasing the pulse width of the Off writing pulse $P_{off}$ (S12 thru S17).

As described above, according to the ReRAM of the fifth embodiment, the control circuitry repeats a sequence of verify Off writing including a series of steps for gradually increasing the pulse width of the Off writing pulse $P_{off}$, while gradually increasing the voltage of the Off writing pulse $P_{off}$ by each sequence, until a predetermined Off resistance value has been reached. Thereby, it is possible to prevent the pulse width from extending excessively and improve the efficiency of verify Off writing in the process of verify Off writing which is executed by gradually increasing the pulse width of the Off writing pulse $P_{off}$.

As a parameter other than the pulse width to be combined with verify Off writing which is executed by gradually increasing the pulse width of the Off writing pulse $P_{off}$, in addition to the amplitude of the voltage of the Off writing pulse $P_{off}$, for example, inter alia, a rewriting current required to switch over the resistance state of the variable resistance element VR can be used. The above rewriting current can be controlled by, e.g., the voltage applied to the word line WL or the current source external to the memory cell array MCA.

Although an instance of Off writing has been described by way of example in the present embodiment, application to On writing is also possible. For example, in an inverse manner to control in Off writing, the bit line BL is replaced with the plate line PL as a signal line supplying a writing pulse and the control circuitry appropriately adjusts a voltage which is applied to the word line WL without changing the condition for applying the reading pulse $P_R$ for verification. In this way, verify On writing with the pulse width being increased gradually can be implemented.

Sixth Embodiment

In the foregoing first through fifth embodiments, descriptions have been provided, taking, as an example, the structure in which a memory cell MC storing one bit of information is included of one variable resistance element VR and one selection transistor TR. The methods described in the embodiments, basically, can also be applied to a ReRAM of a so-called, cross-point type structure, except for a structure requiring a selection transistor TR, as set forth in the third embodiment.

Figure 20:
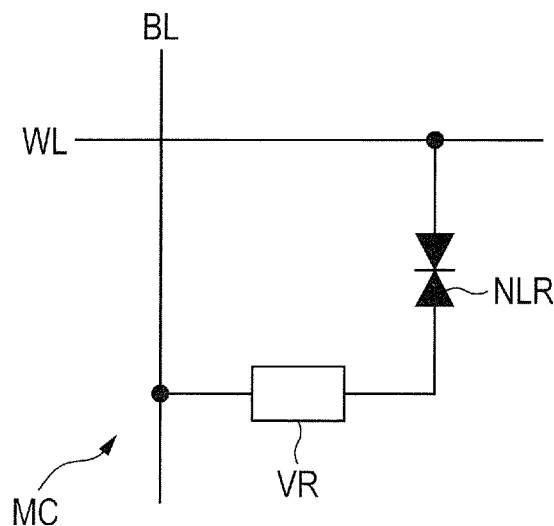
FIG. 20 is a diagram depicting a schematic structure example of a memory cell of a cross-point type ReRAM.

FIG. 20 is a diagram depicting a schematic structure example of a memory cell of a cross-point type ReRAM. As depicted, the variable resistance element VR is coupled to the word line WL and bit line BL without a switch inbetween. It is preferable that a nonlinear resistance element NLR is coupled in series to the variable resistance element VR. Although it is not determinative whether the metal layer M1 or the metal layer M2 of the variable resistance element VR is coupled to the bit line BL, descriptions will be provided below, assuming that the metal layer M1 is coupled to the bit line BL.

Figure 21:
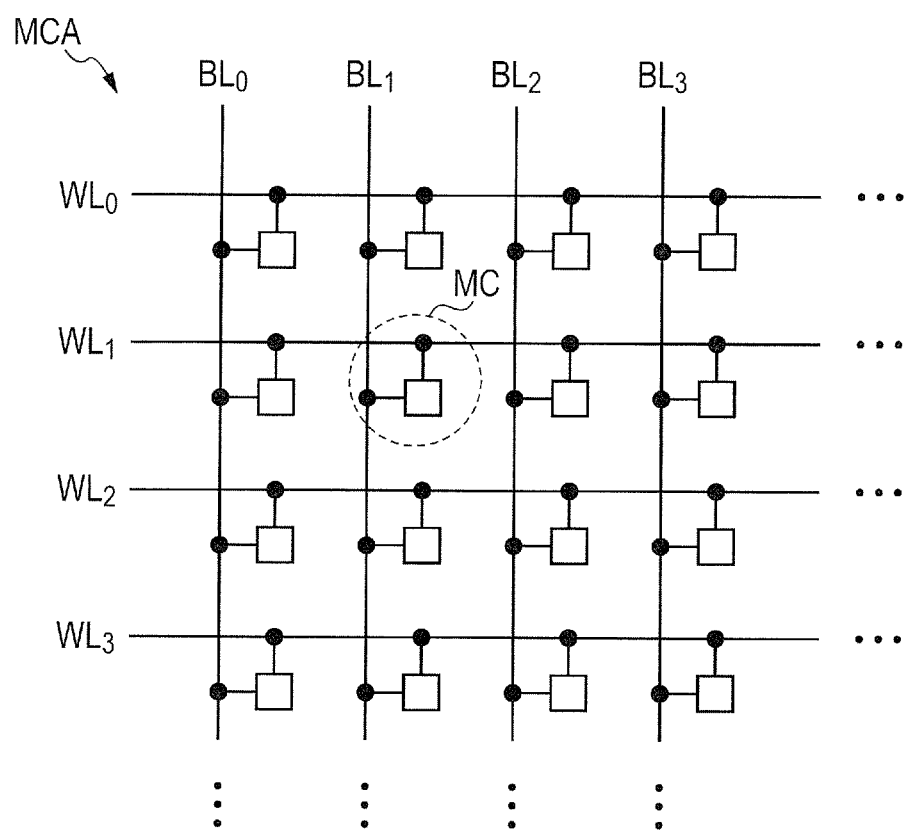
FIG. 21 is a diagram depicting a schematic structure example of a memory cell array of the cross-point type ReRAM.

FIG. 21 is a diagram depicting a schematic structure example of a memory cell array of the cross-point type ReRAM. A memory cell array MCA can be configured by arranging memory cells MCs, one of which was depicted in FIG. 20, in a matrix. An example of a memory cell array MCA depicted in FIG. 21 is formed of a matrix of 4 rows×4 columns, having a storage capacity of 16 bits; a larger storage capacity can be realized by increasing the number of rows and columns of the array appropriately.

The memory cells MC each are coupled to nodes where word lines $WL_0$ to $WL_3$ intersect with bit lines $BL_0$ to $BL_3$. All the word lines $WL_0$ to $WL_3$ and bit lines $BL_0$ to $BL_3$ are coupled to control circuits, not depicted, in the periphery of the memory cell array MCA. For example, the word lines $WL_0$ to $WL_3$ are coupled to a word line control circuit, not depicted, on the left side in the drawing of the memory cell array MCA. The bit lines $BL_0$ to $BL_3$ are coupled to a bit line control circuit, not depicted, on the upper side in the drawing.

Control circuitry included of the above-mentioned respective control circuits writes a memory cell by applying a voltage to the appropriate bit line and word line, thus turning the desired memory cell MC into a high or low resistance state. The control circuitry reads a memory cell by detecting a current flowing through the appropriate bit line or word line and deciding whether the desired memory cell is placed in a high or low resistance state.

For example, to write a memory cell MC surrounded by a dotted circle to turn it into an On state, a word line $WL_1$ should be placed at a high potential, a bit line $BL_1$ should be placed at a zero potential, and other word lines $WL_0$, $WL_2$, and $WL_3$ and bit lines $BL_0$, $BL_2$, and $BL_3$ should be placed at one half of the high potential. Inversely, to write the memory cell MC surrounded by a dotted circle to turn it into an OFF state, the word line $WL_1$ should be placed at the zero potential, the bit line $BL_1$ should be placed at a high potential, and other word lines $WL_0$, $WL_2$, and $WL_3$ and bit lines $BL_0$, $BL_2$, and $BL_3$, and other word lines $WL_0$, $WL_2$, and $WL_3$ and bit lines $BL_0$, $BL_2$, and $BL_3$ should be placed at one half of the high potential.

To read whether the memory cell MC surrounded by a dotted circle is placed in an On state or Off state, the bit line $BL_1$ should be placed at the zero potential, other bit lines $BL_0$, $BL_2$, and $BL_3$ and all word lines $WL_0$ to $WL_3$ should be placed at a high potential (which is, however, sufficiently lower than in writing), and a current flowing through the word line $WL_1$ should be detected.

By an operation described above, the high potential is applied to both ends of only the memory cell MC coupled to the word line $WL_1$ and the bit line $BL_1$ and one half of the high potential or the zero potential is applied to other memory cells MCs. Hence, only the memory cell MC surrounded by a dotted circle is written or read. Writing and reading other memory cells MCs can be performed in the same way as described above.

The nonlinear resistance element NLR in the memory cell depicted in FIG. 20 has a characteristic in which it becomes high resistive when there is a small potential difference between both ends and becomes low resistive when there is a large potential difference. Hence, in other memory cells MCs which share the bit line $BL_1$ or the word line $WL_1$ with the memory cell MC surrounded by a dotted circle in FIG. 21, in other words, memory cells MC to which a voltage of one half of the high potential may be applied, the NLR has a function of decreasing the voltage applied to the variable resistance element VR and preventing erroneous writing and erroneous reading.

Even to the cross-point type ReRAM described above, the verify writing methods set forth in the foregoing first, second, fourth, and fifth embodiments can be applied. That is, in the process of verify rewriting which is executed by gradually increasing the pulse width of the Off writing pulse $P_{off}$, by once applying the On writing pulse $P_{on}$ with constant pulse width and voltage as a reset pulse before rewriting, it would become possible to perform optimal Off writing efficiently.

While the invention developed by the present inventors has been described specifically based on its embodiments hereinbefore, it goes without saying that the present invention is not limited to the foregoing embodiments and various modifications may be made thereto without departing from the scope of the invention.

What is claimed is:

1. A semiconductor storage device comprising:
   memory cells, each comprising a variable resistance element; and
   control circuitry that executes a first writing process of applying a first writing pulse to a memory cell to turn the memory cell state into a first resistance state in which the resistance value of the variable resistance element meets a first criterion and a second writing process of applying a second writing pulse of opposite polarity to the first writing pulse to turn the memory cell into a second resistance state meeting a second criterion, wherein the control circuitry, when the memory cell is placed in the second resistance state, after applying the first writing pulse to the memory cell, applies a reading pulse for a verify process of reading whether the variable resistance element is placed in the first resistance state or the second resistance state, and wherein, if the memory cell is not placed in the first resistance state as a result of the verify process, the control circuitry applies a reset pulse comprising the second writing pulse of a constant width to the memory cell, applies the first writing pulse with a pulse width made longer than the first writing pulse applied last, and executes the verify process in mentioned order.

2. The semiconductor storage device according to claim 1, wherein the control circuitry applies a pulse that is weaker than the second writing pulse as the reset pulse.

3. The semiconductor storage device according to claim 2, wherein the control circuitry applies a pulse whose voltage amplitude is smaller than the second writing pulse as the reset pulse.

4. The semiconductor storage device according to claim 2, wherein the control circuitry, when applying the reset pulse, causes a current for writing to be smaller than when applying the second writing pulse.

5. The semiconductor storage device according to claim 2, wherein the control circuitry applies a pulse with a shorter pulse width than the second writing pulse as the reset pulse.

6. The semiconductor storage device according to claim 1, wherein, if the memory cell is not placed in the first resistance state as a result of the verify process, the control circuitry extends pulse width by adding a predetermined value to the pulse width of the first writing pulse applied last.

7. The semiconductor storage device according to claim 1, Wherein, if the memory cell is not placed in the first resistance state as a result of the verify process, the control circuitry extends pulse width by multiplying the pulse width of the first writing pulse applied last by a predetermined value.

8. The semiconductor storage device according to claim 1, wherein, if the memory cell is not placed in the first resistance state as a result of the verify process, the control circuitry repeats applying a reset pulse comprising the second writing pulse to the memory cell, applying the same pulse as the first writing pulse applied last, and executing the verify process in mentioned order by a predetermined number of times, and even after that, if the first writing is unsuccessful, the control circuitry applies the first writing pulse with a pulse width made longer than the first writing pulse applied last, followed by executing the verify process.

9. The semiconductor storage device according to claim 1, wherein the first resistance state is a state in which the resistance value of the variable resistance element is equal to or more than a first criterion value and the second resistance state is a state in which the resistance value of the variable resistance element is less than a second criterion value.

10. The semiconductor storage device according to claim 1, wherein the first resistance state is a state in which the resistance value of the variable resistance element is less than the first criterion value and the second resistance state is a state in which the resistance value of the variable resistance element is equal to or more than the second criterion value.

11. The semiconductor storage device according to claim 10, wherein, if the memory cell is not placed in the first resistance state as a result of the verify process, the control circuitry applies a reset pulse comprising the second writing pulse to the memory cell, applies the first writing pulse more times than when it last applied the first writing pulse, and executes the verify process in mentioned order.

12. The semiconductor storage device according to claim 1, wherein, if the memory cell is not placed in the first resistance state even after having repeated the first writing pulse application and the verify process by a predetermined number of times, the control circuitry increases the amplitude of the voltage of the first writing pulse and initializes the pulse width of the first writing pulse and then repeats the first writing pulse application and the verify process.

13. The semiconductor storage device according to claim 1, wherein the control circuitry applies the first writing pulse with a pulse width made longer than the first writing pulse applied last for each successive cycle.

14. The semiconductor storage device according to claim 1, wherein the first writing pulse and the second writing pulse, each having constant amplitudes for each cycle.

15. A semiconductor device, comprising:

a memory cell; and control circuitry that executes a first writing process of applying a first writing pulse to the memory cell to turn the memory cell state into a first resistance state in which the resistance value of the variable resistance element meets a first criterion and a second writing process of applying a second writing pulse of opposite polarity to the first writing pulse to turn the memory cell into a second resistance state meeting a second criterion, wherein the control circuitry, when the memory cell is placed in the second resistance state, after applying the first writing pulse to the memory cell, applies a reading pulse for a verify process of reading whether the variable resistance element is placed in the first resistance state or the second resistance state, and wherein, when the memory cell is not placed in the first resistance state as a result of the verify process, the control circuitry applies a reset pulse comprising the second writing pulse of a constant width to the memory cell, applies the first writing pulse with a pulse width made longer than the first writing pulse applied last, and executes the verify process.

16. The semiconductor storage device according to claim 15, wherein the control circuitry applies a pulse that is weaker than the second writing pulse as the reset pulse.

17. The semiconductor storage device according to claim 16, wherein the control circuitry applies a pulse whose voltage amplitude is less than the second writing pulse as the reset pulse.

18. The semiconductor storage device according to claim 16,
wherein the control circuitry, when applying the reset pulse, causes a current for writing to be less than when applying the second writing pulse.

19. The semiconductor storage device according to claim 16,
wherein the control circuitry applies a pulse with a shorter pulse width than the second writing pulse as the reset pulse, and
wherein, when the memory cell is not placed in the first resistance state as a result of the verify process, the control circuitry extends pulse width by adding a predetermined value to the pulse width of the first writing pulse applied last for each successive cycle.

20. A method of a semiconductor storage device, the method comprising:
executing, by a control circuitry, a first writing process of applying a first writing pulse to a memory cell to turn the memory cell state into a first resistance state in which the resistance value of the variable resistance element meets a first criterion and a second writing process of applying a second writing pulse of opposite polarity to the first writing pulse to turn the memory cell into a second resistance state meeting a second criterion;
applying, by the control circuitry, a reading pulse for a verify process of reading whether the variable resistance element is placed in the first resistance state or the second resistance state when the memory cell is placed in the second resistance state, after applying the first writing pulse to the memory cell;
when the memory cell is not placed in the first resistance state as a result of the verify process, applying by the control circuitry, a reset pulse comprising the second writing pulse of a constant width to the memory cell;
applying the first writing pulse with a pulse width made longer than the first writing pulse applied last; and
executing the verify process again.

21. The semiconductor storage device according to claim 1,
wherein, when the memory cell is determined to not be in the first resistance state as the result of the verify process, the control circuitry applies the reset pulse comprising the second writing pulse of the constant width for each cycle to the memory cell, and then applies the first writing pulse with the pulse width made longer by a certain pattern increase with each cycle than the first writing pulse applied last.

22. The semiconductor storage device according to claim 1,
wherein a width and a voltage of the second writing pulse of the opposite polarity is kept constant, and
wherein the first writing pulse with the pulse width made longer is an OFF writing pulse.

* * * * *